US005178985A

United States Patent [19]

Tsujimoto et al.

[11] Patent Number: 5,178,985

[45] Date of Patent: Jan. 12, 1993

[54] IMAGE FORMING METHOD COMBINING HEAT AND PRESSURE TO PRODUCE A COLOR IMAGE

[75] Inventors: Yoshiharu Tsujimoto, Yamatokoriyama; Kunio Ohashi; Yoshikazu Fujiwara, both of Nara; Hiromu Sasaki, Yamatokoriyama, all of Japan

[73] Assignee: Sharp Kabushiki Kaisha, Osaka, Japan

[21] Appl. No.: 668,698

[22] Filed: Mar. 7, 1991

Related U.S. Application Data

[63] Continuation of Ser. No. 453,258, Dec. 20, 1989, abandoned, which is a continuation of Ser. No. 222,820, Jul. 22, 1988, abandoned.

[30] Foreign Application Priority Data

Jul. 23, 1987 [JP] Japan .............................. 62-184347

[51] Int. Cl.$^5$ .......................... G03C 1/72; G03C 8/50

[52] U.S. Cl. .................................... 430/138; 430/203; 430/254

[58] Field of Search .............. 430/138, 203, 254, 253, 430/256, 260; 355/27, 28, 30, 32

[56] References Cited

U.S. PATENT DOCUMENTS

| | | | |
|---|---|---|---|
| 4,399,209 | 8/1983 | Sanders et al. | 430/138 |
| 4,663,266 | 5/1987 | Adair et al. | 430/138 |
| 4,788,124 | 11/1988 | Wright | 430/254 |
| 4,877,710 | 10/1989 | Ishikawa | 430/138 |
| 4,891,299 | 1/1990 | Yamada | 430/203 |
| 4,905,036 | 2/1990 | Asano et al. | 430/138 |
| 4,977,057 | 12/1990 | Ishikawa et al. | 430/203 |

FOREIGN PATENT DOCUMENTS

| | | | |
|---|---|---|---|
| 63-309943 | 12/1988 | Japan | 430/254 |

*Primary Examiner*—Marion E. McCammish
*Assistant Examiner*—Janis L. Dote

[57] ABSTRACT

A method for image formation comprising the steps of exposing a light-receiving sheet coated with a layer of microcapsules containing photopolymerization agent and colorless dye selectively to light so as to form a cured image thereon opposite in sense to the desired final image, laying an image-receiving sheet uniformly coated with a layer of a developing material for reacting with and coloring the colorless dye on the light-receiving sheet, heating the resulting sandwich configuration and pressing these sheets against each other thereby rupturing the uncured microcapsules to form a colored image.

4 Claims, 1 Drawing Sheet

71 7 62 6 72 63 61 33 A 5 64 23 23 32 43 41 13 21b 42 11 12 1 11 21a 22 21c 31 2 3 4

IMAGE FORMING METHOD COMBINING HEAT AND PRESSURE TO PRODUCE A COLOR IMAGE

This application is a continuation of application Ser. No. 07/453,258 filed on Dec. 20, 1989, now abandoned, which is a continuation of application Ser. No. 07/222,820 filed on Jul. 22, 1988, now abandoned.

BACKGROUND OF THE INVENTION

The present invention relates to improvements in the method for forming an image by color reaction between a ligh-receiving sheet and an image-receiving sheet. A photo-sensitive and pressure-sensitive image forming member made up of a light-receiving sheet coated with a layer of microcapsules including a photopolymerization agent and colorless dye through a binder resin and an image-receiving sheet coated with a layer of a developer material for coloring the colorless dye through a binder resin is already disclosed in U.S. Pat. No. 4,399,209. The method for image formation using such a photo-sensitive and pressure-sensitive image forming member will be briefly described below. When the aforesaid light-receiving sheet is selectively illuminated by image forming light, such as reflected light from an original, the photopolymerization agent in the microcapsules located at the position exposed to the light is cured by polymerization and a cured image is thereby formed. Then the light-receiving sheet and the image-receiving sheet are laid one upon the other and pressed together by means of pressure rollers or the like, whereby the microcapsules which are not cured by polymerization are ruptured and the colorless dye contained therein flows out to attach to the image-receiving sheet and forms a color image by reaction with the a developer material on the image receiving sheet. A colored image is thus formed on the image-receiving sheet.

In the above described image forming method, however, extremely high pressure is required for causing the light-receiving sheet and the image-receiving sheet sandwiched one upon the other to be compressed so that the microcapsules may be ruptured. Hence, sometimes there are formed wrinkles in the light-receiving sheet and image-receiving sheet.

Further, when forming an image according to the described method, it sometimes occurs that the color is not formed sufficiently because of a slow reaction rate between the colorless dye and the developer material and hence the formed image becomes blurred. Therefore, it has been practiced to heat the image-receiving sheet with the colored image formed thereon through the compression by the pressure rollers by means of a heat roller or the like so that the coloring reaction may be promoted. However, when a heat roller is used and its surface temperature is raised several ten degrees above 100 degrees to accelerate the reaction rate, it sometimes occurs that the binder of the image-receiving sheet attaches to the heat roller and offsetting is caused.

SUMMARY OF THE INVENTION

Therefore, it is an object of the present invention to provide a method of image formation, wherein a light-receiving sheet and an image-receiving sheet are subjected to a heating process before the respective sheets are pressed together, so that rupturing of the microcapsules may be facilitated and the coloring reaction accelerated, and, as a result, the light-receiving sheet and the image-receiving sheet are prevented from wrinkling and offsetting.

In accordance with the present invention, in a method for image formation forming a colored image by the use of the above described light-receiving sheet and image-receiving sheet, there is provided a means for heating the light-receiving sheet and image-receiving sheet before they are pressed together.

BRIEF DESCRIPTION OF THE DRAWINGS

The present invention will become more fully understood from the detailed description given hereinbelow and the accompanying drawings which are provided for the purpose of illustration only, and thus are not limitative of the present invention and wherein.

DETAILED DESCRIPTION OF THE PREFERRED EMBODIMENTS

Figure 1:
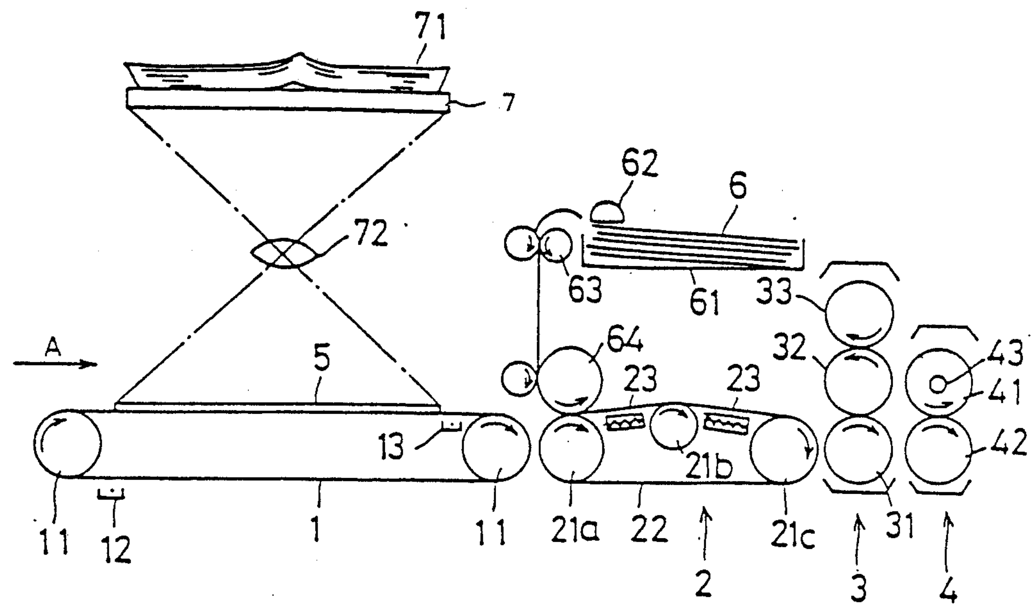
FIG. 1 is a schematic diagram showing construction of the principal components of a copying machine to which the method for image formation according to the present invention is applied.

Referring now to FIG. 1, there is seen a copying machine including an exposure belt 1, heating device 2, pressure rollers 3, and heat rollers 4 disposed virtually in a line in the order named. A light-receiving sheet 5 is moved past these devices successively in the direction as indicated by the arrow A whereby an image forming process is performed. Above the heating device 2, there is provided a supply sheet cassette 61 containing image-receiving sheets 6 as well as a sheet supply roller 62 and transport rollers 63, 64, whereby the image-receiving sheets 6 are individually transported to the heating device 2. Further, opposing the exposure belt 1, there is provided an original platen 7 made of a transparent glass and others. On the original platen 7, an original 71 is set to be scanned by a light source or the like, not shown, and reflected light from the original is thrown on the exposure belt 1 through a lens 72.

The exposure belt 1 is an insulating belt passed around rotating rollers 11, 11 and there are provided an electrifying charger 12 opposing its lower portion and a charge-eliminating charger 13 opposing its upper portion at the front side. The heating device 2 includes a heat resisting belt 22 passed around rotating rollers 21*a* to 21*c* and heaters 23, 23. The rotating roller 21*a* at the rear side is in abutment with the transport roller 64 and one of the image-receiving sheets 6 is fed into the position of abutment. The pressure rollers 3 are made up of a first roller 31, second roller 32, and a third roller 33. The first roller 31 and the second roller 32 are disposed in parallel with each other, while the third roller 33 is disposed at an angle with the second roller 32. Accordingly, the sandwich configuration of the light-receiving sheet 5 and image-receiving sheet 6 passing between the first roller 31 and the second roller 32 are uniformly compressed. The heat rollers 4 consist of an upper heat roller 41 and a lower heat roller 42, and there is provided a heater lamp 43 within the upper roller 41 for holding the surface of the upper roller 41 at a predetermined temperature.

Figure 2:
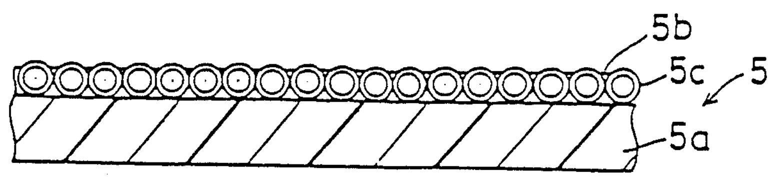
FIG. 2 is a sectional view of a light-receiving sheet for use in the aforesaid image formation method.
Figure 3:
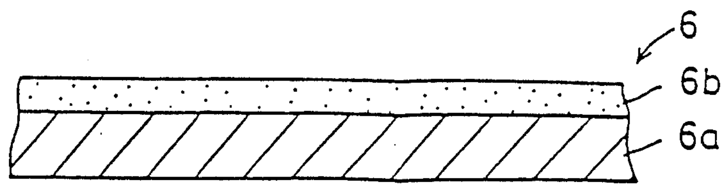
FIG. 3 is a sectional view of an image-receiving sheet for use in the aforesaid image formation method.

FIG. 2 is a sectional view of the light-receiving sheet 5. The light-receiving sheet 5 is formed of a substrate sheet 5*a* made of a resin film and a coating of microcapsules 5c formed thereon through a resin binder 5b. The microcapsule 5c is formed of a resin shell containing a medium with colorless dye and photopolymerization agent dispersed therein. FIG. 3 is a sectional view of the image-receiving sheet 6. The image-receiving sheet 6 is formed of a substrate sheet 6a made of a sheet of paper and a coating of a developing material 6b formed on the substrate through a binder not shown.

The image forming operation with respect to the copying machine structured above will be described below.

The exposure belt 1 is first charged by the electrifying charger 12 and then a light-receiving sheet 5 is supplied onto the exposure belt 1, such that the light-receiving sheet 5 is held at an electrostatic potential. The light-receiving sheet 5 is transported on the exposure belt 1 with the microcapsule surface 5c turned upward and forms a cured image thereon upon being illuminated by reflected light from an original 71. At this time, since the light-receiving sheet 5 is held down by electrostatic attraction onto the exposure belt 1, no distortion is produced in the image. Since the exposure belt 1 is deprived of the electric charges at its upper front portion by means of the charge-eliminating charger 13, the light-receiving sheet 5 being electrostatically held thereon up to this point is separated therefrom and sent into the heating device 2.

On the other hand, keeping pace with these operations, an image-receiving sheet 6 is delivered from the paper supply cassette 61. That is, the image-receiving sheet 6 is brought adjacent to the light-receiving sheet 5 with its front edge coming into agreement with that of the light-receiving sheet 5 and its surface coated with the developing material 6b coming to lie on the surface of the light-receiving sheet 5 coated with the microcapsules 5c. The light-receiving sheet 5 together with the image-receiving sheet 6, the latter lying on the former, are transported while supported on the heat resisting belt 22 of the heating device 2.

The light-receiving sheet 5 and image-receiving sheet 6 are heated by the heaters 23, 23 of the heating device 2, whereby the binders used for coating these substrates with the microcapsules 5c and the developing material 6b are softened and the viscosity of the medium within the microcapsules 5c is lowered. Under such conditions, the sheets are pressed together by the first roller 31 and second roller 32 while the sheets are transported by the pressure rollers 3. At this time, since the binders in the light-receiving sheet 5 and image-receiving sheet 6 are softened, as described above, both the sheets 5 and 6 are put in close face-to-face contact and wrinkle formation due to relative slippage of both of the sheets 5, 6 is prevented from occurring. Further, since the viscosity of the medium in the microcapsules 5c is lowered, the colorless dye is enabled to flow out of the microcapsules 5c even if only small openings are made in the resin shells. Hence, the pressure of the pressure rollers 3 necessary for rupturing the microcapsules 5c can be decreased and, because of this, wrinkling is further prevented all the more.

When the microcapsules 5c are ruptured, the colorless dye contained therein flows out and forms a color by reacting with the developing material 6b of the image-receiving sheet 6. At this time, since the colorless dye and the developer material 6b are preheated by the heating device 2, the coloring reaction is accelerated.

The light-receiving sheet 5 and image-receiving sheet 6 compressed by the pressure rollers 3 are separated from each other after the compression and the light-receiving sheet 5 is discharged to the outside of the illustrated portion. The image-receiving sheet 6 is heated by the heat rollers 4 so that its coloring is further accelerated. At this time, since the coloring reaction has already been promoted through heating by the heating device 2, the surface temperature of the heat roller 41 can be as low as less than 100 degrees centigrade or so, whereby the binder of the image-receiving sheet 6 can be prevented from offsetting to the upper roller 41.

In the described method, wrinkle formation in the light-receiving sheet 5 and image-receiving sheet 6 and offsetting of the binder to the heat roller 4 can be prevented.

Although heating by the heat rollers 4 was designed to take place after compression by the pressure rollers 3 in the above embodiment, the provision of the heat rollers 4 are not necessarily required since sufficient coloring is facilitated by heating by the heating device 2 alone.

According to the method of image formation of the present invention, since a good face-to-face contact between the light-receiving sheet and image-receiving sheet is achieved by the heating performed prior to the compression, wrinkle formation while these members or sheets are compressed is prevented. And since the colorless dye within the microcapsules is made more fluid by the preheating, it becomes unnecessary to completely rupture the microcapsules and the pressure for compressing the sheets can be lowered, hence wrinkle formation can be prevented all the more. Further, since the pressure for compression can be lowered, the pressure device necessary can be made smaller and simpler and the cost of production reduced.

Furthermore, the problem of offsetting is overcome and cost of production of the heat roller is reduced since the surface temperature of the heat roller can be lowered or the provision of the heat roller itself can be eliminated by acceleration of the coloring reaction obtained by the heating performed prior to the compression.

While only certain embodiments of the present invention have been described, it will be apparent to those skilled in the art that various changes and modifications may be made therein without departing from the spirit and scope of the present invention as claimed.

What is claimed is:

1. A method for color image formation comprising the sequential steps of:

providing a light-receiving sheet coated with a layer of microcapsules dispersed in a binder resin, said microcapsules containing a photopolymerization agent and a colorless dye medium;

selectively exposing said light-receiving sheet to actinic radiation thereby forming a cured image thereon opposite in sense to the final image desired leaving uncured microcapsules in an image configuration for the final image desired;

contacting an image-receiving sheet coated with a developer layer comprising a binder and a developer material for reacting with and coloring said colorless dye in said microcapsules on said light-receiving sheet with said light-receiving sheet such that said developer layer is in surface contact with said exposed surface of said light-receiving sheet to form a sandwich configuration;

preheating said sandwich configuration of said light-receiving sheet and said image-receiving sheet to a temperature such that said binders of said light-receiving sheet and said image-receiving sheet are softened thereby enhancing adhesion between said light-receiving and image-receiving sheets and lowering the viscosity of said medium within said microcapsules;

applying pressure to said heated sandwich configuration of said light-receiving sheet and said image-receiving sheet by a pressure means thereby rupturing the uncured microcapsules on said light-receiving sheet, releasing said colorless dye to react with said developer material to form a colored image on said image-receiving sheet, said preheating taking place before said image-receiving sheet and said light-receiving sheet are pressured together;

separating said light-receiving sheet from said image-receiving sheet following said image forming pressure step; and post-heating said image-receiving sheet by heat roller means to accelerate and complete image development at a temperature such that said binder will not offset to said heat roller means.

2. The method of claim 1, wherein said post-heating step following said pressure-imaging step is accomplished at a temperature of less than 100° C.

3. The method for color image formation as claimed in claim 1, wherein said sandwich configuration of said light-receiving sheet and said image-receiving sheet, said image-receiving sheet lying on said light-receiving sheet, is preheated by a heating means disposed below said light-receiving sheet.

4. The method for color image formation as claimed in claim 1, wherein said heat roller means for post-heating said image-receiving sheet comprises upper and lower heat rollers and a heater lamp disposed within said upper heat roller to keep a surface of said upper heat roller at such a predetermined temperature as can prevent said binder from offsetting to said upper heat roller, and a heating means for preheating said sandwich configuration of said light-receiving sheet and said image-receiving sheet is disposed on the opposite side of said image-receiving sheet from said upper roller.

* * * * *